United States Patent
Erivantcev et al.

(10) Patent No.: US 10,540,006 B2
(45) Date of Patent: Jan. 21, 2020

(54) TRACKING TORSO ORIENTATION TO GENERATE INPUTS FOR COMPUTER SYSTEMS

(71) Applicant: Finch Technologies Ltd., Fish Bay, Tortola (VG)

(72) Inventors: Viktor Vladimirovich Erivantcev, Ufa (RU); Rustam Rafikovich Kulchurin, Ufa (RU); Alexander Sergeevich Lobanov, Ufa (RU); Iakov Evgenevich Sergeev, Ufa (RU); Alexey Ivanovich Kartashov, Moscow (RU)

(73) Assignee: FINCH TECHNOLOGIES LTD., Fish Bay, Tortola (VG)

( * ) Notice: Subject to any disclaimer, the term of this patent is extended or adjusted under 35 U.S.C. 154(b) by 0 days.

(21) Appl. No.: 15/813,813

(22) Filed: Nov. 15, 2017

(65) Prior Publication Data

US 2018/0335834 A1 Nov. 22, 2018

Related U.S. Application Data (60) Provisional application No. 62/507,090, filed on May 16, 2017.

(51) Int. Cl.
*G06F 3/01* (2006.01)
*B81B 7/02* (2006.01)

(52) U.S. Cl.
CPC .............. *G06F 3/012* (2013.01); *B81B 7/02* (2013.01); *G06F 3/011* (2013.01); *G06F 3/016* (2013.01); *B81B 2201/0235* (2013.01); *B81B 2201/0242* (2013.01)

(58) Field of Classification Search
CPC . G06F 3/01; G06F 3/012; G06T 15/70; A63F 13/211
See application file for complete search history.

(56) References Cited

U.S. PATENT DOCUMENTS

| | | | |
|---|---|---|---|
| 8,187,100 B1 | 5/2012 | Kahn et al. | |
| 8,933,886 B2 | 1/2015 | Imoto et al. | |
| 8,988,438 B2 | 3/2015 | Bang et al. | |
| 9,141,194 B1* | 9/2015 | Keyes | G06F 3/017 |

(Continued)

FOREIGN PATENT DOCUMENTS

| | | |
|---|---|---|
| CN | 103226398 | 7/2013 |
| WO | 2016183812 | 11/2016 |
| WO | 2016209819 | 12/2016 |

OTHER PUBLICATIONS

U.S. Appl. No. 15/492,915, filed Apr. 20, 2017, Viktor Erivantcev, et al, Non Final Action dated, Apr. 18, 2018.

(Continued)

*Primary Examiner* — Priyank J Shah
(74) *Attorney, Agent, or Firm* — Greenberg Traurig, LLP (57) ABSTRACT

A system including: two arm modules each having an inertial measurement unit and attached to an upper arm of a user to measure the current orientations of the upper arms of the user; a head module having an inertial measurement unit and attached to the head of the user to measure the current orientation of the head; and a computing device coupled to the arm modules and the head module to calculate, based on the current orientations of the upper arms and the current orientation of the head, the current orientation of the torso of the user.

19 Claims, 3 Drawing Sheets

(56) References Cited

U.S. PATENT DOCUMENTS

| | | | |
|---|---|---|---|
| 9,278,453 | B2 | 3/2016 | Assad |
| 9,405,372 | B2 | 8/2016 | Yen et al. |
| D772,986 | S | 11/2016 | Chen et al. |
| 9,504,414 | B2 | 11/2016 | Coza et al. |
| 9,600,925 | B2 | 3/2017 | Katz et al. |
| 9,891,718 | B2 | 2/2018 | Connor |
| 9,996,945 | B1 | 6/2018 | Holzer et al. |
| 10,019,806 | B2 | 7/2018 | Perry et al. |
| 10,379,613 | B2 | 8/2019 | Erivantcev et al. |
| 2003/0142065 | A1 | 7/2003 | Pahlavan |
| 2007/0050597 | A1 | 3/2007 | Ikeda |
| 2007/0273610 | A1 | 11/2007 | Baillot |
| 2008/0088468 | A1 | 4/2008 | Kim |
| 2009/0322763 | A1* | 12/2009 | Bang ................. G06F 3/011 345/474 |
| 2010/0079466 | A1 | 4/2010 | Griffin |
| 2011/0161804 | A1 | 6/2011 | Park et al. |
| 2012/0025945 | A1 | 2/2012 | Yazadi et al. |
| 2012/0130203 | A1 | 5/2012 | Stergiou et al. |
| 2012/0214591 | A1 | 8/2012 | Ito et al. |
| 2012/0293410 | A1 | 11/2012 | Bell |
| 2014/0028547 | A1 | 1/2014 | Bromley et al. |
| 2014/0201689 | A1 | 7/2014 | Bedikian et al. |
| 2014/0313022 | A1 | 10/2014 | Moeller et al. |
| 2015/0062086 | A1 | 3/2015 | Nattukallingal |
| 2015/0077347 | A1 | 3/2015 | O'Green |
| 2015/0145860 | A1 | 5/2015 | Craig et al. |
| 2015/0145985 | A1 | 5/2015 | Gourlay et al. |
| 2015/0277559 | A1 | 10/2015 | Vescovi et al. |
| 2015/0358543 | A1 | 12/2015 | Kord |
| 2016/0005232 | A1* | 1/2016 | Quarles ................ G06T 19/006 345/633 |
| 2016/0054797 | A1 | 2/2016 | Tokubo et al. |
| 2016/0077608 | A1 | 3/2016 | Nakasu et al. |
| 2016/0187969 | A1 | 6/2016 | Larsen et al. |
| 2016/0306431 | A1 | 10/2016 | Stafford et al. |
| 2016/0313798 | A1 | 10/2016 | Connor |
| 2016/0378204 | A1 | 12/2016 | Chen et al. |
| 2017/0053454 | A1 | 2/2017 | Katz et al. |
| 2017/0083084 | A1* | 3/2017 | Tatsuta .................. G06F 3/147 |
| 2017/0115728 | A1 | 4/2017 | Park et al. |
| 2017/0308165 | A1* | 10/2017 | Erivantcev ............ A63F 13/211 |
| 2017/0352188 | A1 | 12/2017 | Levitt |
| 2018/0095637 | A1 | 4/2018 | Valdivia et al. |
| 2018/0101989 | A1 | 4/2018 | Frueh et al. |
| 2018/0165879 | A1 | 6/2018 | Holzer et al. |
| 2018/0217680 | A1 | 8/2018 | Sudou et al. |
| 2018/0225517 | A1 | 8/2018 | Holzer et al. |
| 2018/0253142 | A1 | 9/2018 | Tsuchie et al. |
| 2018/0313867 | A1* | 11/2018 | Erivantcev ............. G01P 21/00 |
| 2018/0335834 | A1* | 11/2018 | Erivantcev ............. G06F 3/012 |
| 2018/0335843 | A1 | 11/2018 | Erivantcev et al. |
| 2018/0335855 | A1* | 11/2018 | Erivantcev ............ A63F 13/235 |
| 2019/0187784 | A1* | 6/2019 | Erivantcev ............. G06F 3/012 |
| 2019/0212359 | A1 | 7/2019 | Erivantcev et al. |
| 2019/0212807 | A1 | 7/2019 | Erivantcev et al. |

OTHER PUBLICATIONS

U.S. Appl. No. 15/787,555, filed Oct. 18, 2017, Viktor Erivantcev, et al, Docketed New Case—Ready for Examination, Jan. 9, 2018.
U.S. Appl. No. 15/847,669, filed Dec. 19, 2017, Viktor Erivantcev, et al, Docketed New Case—Ready for Examination, Feb. 2, 2018.
Forward kinematics, Wikipedia, printed on Sep. 21, 2017.
Accessories for Vive, retrieved from https://www.vive.com/us/accessory/ on Jan. 30, 2017.
Daydream, retrieved from https://vr.google.com/daydream/ on Jan. 30, 2017.
Forward kinematics, Wikipedia, retrieved from https://en.wikipedia.org/wiki/Forward_kinematics on Sep. 21, 2017.
Gest—Work with your hands. Wayback Machine 2016. Retrieved from https://web.archive.org/web/20160304012247/https://gest.co/ on Jan. 30, 2017.
Gloveone: Feel Virtual Reality. Wayback Machine 2016. Retrieved from https://web.archive.org/web/20160307080001/https://www.gloveonevr.com/ on Jan. 30, 2017.
International Application No. PCT/US2017/028982, International Search Report and Written Opinion, dated Aug. 24, 2017.
Manus VR—The Pinnacle of Virtual Reality Controllers, Manus VR Development Kit PRO Q4 2016.
Manus VR—The virtual reality dataglove for consumers. Wayback Machine 2016. Retrieved from https://web.archive.org/web/20160417035626/https://manusvr.com/ on Jan. 30, 2017.
NeuroDigital: The VR Technology Factory, retrieved from https://www.neurodigital.es/ on Jan. 30, 2017.
Oculus Rift | Oculus. Retrieved from https://www3.oculus.com/enus/ rift/ on Jan. 30, 2017.
RevolVR Virtual Reality Controllers, retrieved from http://revolvr.co/ on Jan. 30, 2017.
Wireless Gaming Controllers for PC, Mac, and Mobile | SteelSeries, retrieved from https://steelseries.com/gamingcontrollers on Jan. 30, 2017.
Xbox Wireless Controller, retrieved from http://www.xbox.com/en-US/xbox-one/accessories/controllers/xbox-wireless-controller on Jan. 30, 2017.
U.S. Appl. No. 15/492,915, filed Apr. 20, 2017, Viktor Erivantcev, et al, Docketed New Case—Ready for Examination, Aug. 5, 2019.
U.S. Appl. No. 15/817,646, filed Nov. 20, 2017, Viktor Erivantcev, et al, Docketed New Case—Ready for Examination, Jan. 10, 2018.
U.S. Appl. No. 15/787,555, filed Oct. 18, 2017, Viktor Erivantcev, et al, Patented Case, Jul. 24, 2019.
U.S. Appl. No. 15/792,255, filed Oct. 24, 2017, Viktor Erivantcev, et al, Docketed New Case—Ready for Examination, Jan. 9, 2018.
U.S. Appl. No. 16/508,249, filed Jul. 10, 2019, Viktor Erivantcev, et al, Application Dispatched from Preexam, Not Yet Docketed, Jul. 24, 2019.
U.S. Appl. No. 15/847,669, filed Dec. 19, 2017, Viktor Erivantcev, et al, Non Final Action dated, Apr. 8, 2019.
U.S. Appl. No. 15/868,745, filed Jan. 11, 2018, Viktor Erivantcev, et al, Docketed New Case—Ready for Examination, Mar. 2, 2018.
U.S. Appl. No. 15/864,860, filed Jan. 8, 2018, Viktor Erivantcev, et al, Docketed New Case—Ready for Examination, Feb. 12, 2018.
U.S. Appl. No. 15/973,137, filed May 7, 2018, Viktor Erivantcev, et al, Docketed New Case—Ready for Examination, Jul. 2, 2018.
U.S. Appl. No. 16/532,880, Viktor Erivantcev, et al, Application Undergoing Preexam Processing, Aug. 6, 2019.
U.S. Appl. No. 16/044,984, filed Jul. 25, 2018, Viktor Erivantcev, et al, Docketed New Case—Ready for Examination, Aug. 27, 2018.
U.S. Appl. No. 16/534,674, filed Aug. 7, 2019, Alexey Kartashov, et al, Docketed New Case—Ready for Examination, Sep. 20, 2019.

* cited by examiner

Receive motion data from two arm modules identifying orientations of the upper arms of a user  201

Receive motion data from a head module identifying an orientation of the head of the user  203

Calculate an orientation of the torso of the user from the orientations of the upper arms of the user and the orientation of the head of the user  205

TRACKING TORSO ORIENTATION TO GENERATE INPUTS FOR COMPUTER SYSTEMS

RELATED APPLICATIONS

The present application claims the benefit of the filing date of Prov. U.S. Pat. App. Ser. No. 62/507,090, filed May 16, 2017 and entitled "Methods, Systems, and Apparatuses for Determining a Subsequent Movement of a User", the entire disclosure of which is hereby incorporated herein by reference.

The present application relates to U.S. patent application Ser. No. 15/792,255, filed Oct. 24, 2017 and entitled "Tracking Finger Movements to Generate Inputs for Computer Systems", and U.S. patent application Ser. No. 15/787,555, filed Oct. 18, 2017 and entitled "Tracking Arm Movements to Generate Inputs for Computer Systems", both claim the benefit of the filing date of Prov. U.S. Pat. App. Ser. No. 62/507,085, filed May 16, 2017. The present application also relates to U.S. patent application Ser. No. 15/492,915, filed Apr. 20, 2017 and entitled "Devices for Controlling Computers based on Motions and Positions of Hands", which claims the benefit of the filing dates of 62/325,925, filed Apr. 21, 2016 and entitled "Hand-Worn Devices for Controlling Computers based on Motions and Positions of Hands and Fingers", Prov. U.S. Pat. App. Ser. No. 62/463,183, filed Feb. 24, 2017 and entitled "Devices for Controlling Computers based on Motions and Positions of Hands and Arms," Prov. U.S. Pat. App. Ser. No. 62/463,209, filed Feb. 24, 2017 and entitled "Devices for Controlling Computers based on Motions and Positions of Hands," Prov. U.S. Pat. App. Ser. No. 62/463,252, filed Feb. 24, 2017 and entitled "Devices for Controlling Computers based on Motions and Positions of Hands and Arms." The entire disclosures of the above-referenced related applications are hereby incorporated herein by reference.

FIELD OF THE TECHNOLOGY

The embodiments disclosed herein relate to computer input devices in general and more particularly but not limited to input devices for virtual reality and/or augmented/mixed reality applications implemented using computing devices, such as mobile phones, smart watches, similar mobile devices, and/or other devices.

BACKGROUND

U.S. Pat. App. Pub. No. 2014/0028547 discloses a user control device having a combined inertial sensor to detect the movements of the device for pointing and selecting within a real or virtual three-dimensional space.

U.S. Pat. App. Pub. No. 2015/0277559 discloses a finger-ring-mounted touchscreen having a wireless transceiver that wirelessly transmits commands generated from events on the touchscreen.

U.S. Pat. App. Pub. No. 2015/0358543 discloses a motion capture device that has a plurality of inertial measurement units to measure the motion parameters of fingers and a palm of a user.

U.S. Pat. App. Pub. No. 2007/0050597 discloses a game controller having an acceleration sensor and a gyro sensor. U.S. Pat. No. D772,986 discloses the ornamental design for a wireless game controller.

Chinese Pat. App. Pub. No. 103226398 discloses data gloves that use micro-inertial sensor network technologies, where each micro-inertial sensor is an attitude and heading reference system, having a tri-axial micro-electromechanical system (MEMS) micro-gyroscope, a tri-axial micro-acceleration sensor and a tri-axial geomagnetic sensor which are packaged in a circuit board. U.S. Pat. App. Pub. No. 2014/0313022 and U.S. Pat. App. Pub. No. 2012/0025945 disclose other data gloves.

The disclosures of the above discussed patent documents are hereby incorporated herein by reference.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

At least some embodiments disclosed herein allow torso movement tracking without a sensor device attached to the torso of a user. The torso orientation is estimated, predicted, or computed from the orientations of the upper arms of the user and/or the orientation of the head of the user.

Figure 1:
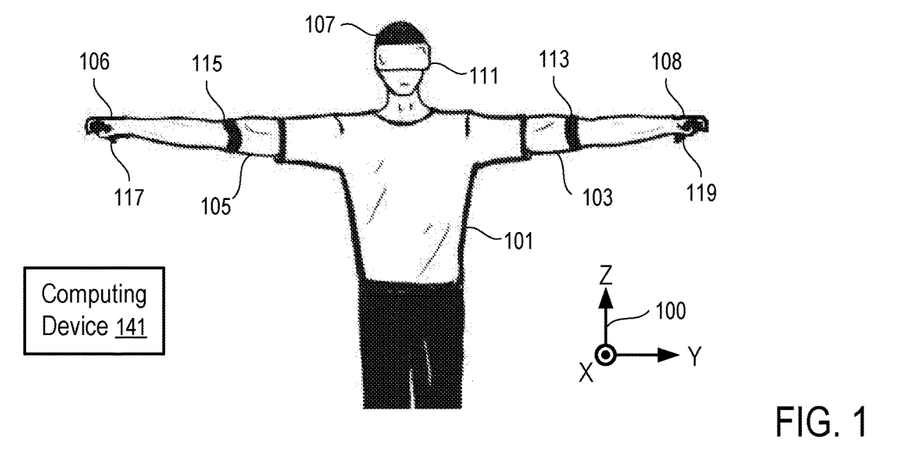
FIG. 1 illustrates a system to track torso movements according to one embodiment.

FIG. 1 illustrates a system to track torso movements according to one embodiment.

In FIG. 1, a user wears a number of sensor devices (111, 113, 115, 117 and 119) that track the orientations of portions of user that are movable relative to the torso (101) of the user and relative to each other, such as the head (107), the upper arms (103 and 105), and the hands (106 and 108).

The sensor devices (111-119) communicate their movement measurements to a computing device (141), which computes or estimates the orientation of the torso (101) from the orientations of the upper arms (103 and 105) and/or the orientation of the head (107) and thus eliminates the need to attach a separate sensor device to the torso (101).

In some implementations, each of the sensor devices (111-119) communicates its measurements directly to the computing device (141) in a way independent from the operations of other sensor devices.

Alternative, one of the sensor devices (111-119) may function as a base unit that receives measurements from one or more other sensor devices and transmit the bundled and/or combined measurements to the computing device (141).

Preferably, wireless connections made via a personal area wireless network (e.g., Bluetooth connections), or a local area wireless network (e.g., Wi-Fi connections) are used to facilitate the communication from the sensor devices (111-119) to the computing device (141).

Alternatively, wired connections can be are used to facilitate the communication among some of the sensor devices (111-119) and/or with the computing device (141).

For example, a hand module (117 or 119) attached to or held in a corresponding hand (106 or 108) of the user may receive the motion measurements of a corresponding arm module (115 or 113) and transmit the motion measurements of the corresponding hand (106 or 108) and the corresponding upper arm (105 or 103) to the computing device (141). Further, the hand module (e.g., 117) may combine its measurements with the measurements of the corresponding arm module (115) to compute the orientation of the forearm connected between the hand (106) and the upper arm (105), in a way as disclosed in U.S. patent application Ser. No. 15/787,555, filed Oct. 18, 2017 and entitled "Tracking Arm Movements to Generate Inputs for Computer Systems", the entire disclosure of which is hereby incorporated herein by reference.

For example, the hand modules (117 and 119) and the arm modules (115 and 113) can be each respectively implemented via a base unit (or a game controller) and an arm/shoulder module discussed in U.S. Pat. App. Pub. Ser. No. 15/492,915, filed Apr. 20, 2017 and entitled "Devices for Controlling Computers based on Motions and Positions of Hands", the entire disclosure of which application is hereby incorporated herein by reference.

In some implementations, the head module (111) is configured as a base unit that receives the motion measurements from the hand modules (117 and 119) and the arm modules (115 and 113) and bundles the measurement data for transmission to the computing device (141). In some instances, the computing device (141) is implemented as part of the head module (111). The head module (111) may further determine the orientation of the torso (101) from the orientation of the arm modules (115 and 113) and/or the orientation of the head module (111), as further discussed below.

For the determination of the orientation of the torso (101), the hand modules (117 and 119) are optional in the system illustrated in FIG. 1.

Further, in some instances the head module (111) is not used, in the tracking of the orientation of the torso (101) of the user.

Typically, the measurements of the sensor devices (111-119) are calibrated for alignment with a common reference system, such as a coordinate system (100).

In FIG. 1, the coordinate system (100) is aligned with a number of directions relative to the user when the user is in a reference pose (e.g., illustrated in FIG. 1). In FIG. 1, the direction Z is parallel to the vertical direction from the feet of the user to the head (107) of the user; the direction Y is parallel to the sideway direction from one hand of the user to another hand of the user; and the direction X is parallel to the front-back direction relative to the user in the reference pose.

Subsequently, the hands, arms (105, 103), the head (107) and the torso (101) of the user may move relative to each other and relative to the coordinate system (100). The measurements of the sensor devices (111-119) provide orientations of the hands (106 and 108), the upper arms (105, 103), and the head (107) of the user relative to the coordinate system (100). The computing device (141) computes, estimates, or predicts the current orientation of the torso (101) from the current orientations of the arms (105, 103) and optionally, the current orientation the head (107) of the user, as further discussed below.

Optionally, the computing device (141) may further compute the orientations of the forearms from the orientations of the hands (106 and 108) and upper arms (105 and 103), e.g., using a technique disclosed in U.S. patent application Ser. No. 15/787,555, filed Oct. 18, 2017 and entitled "Tracking Arm Movements to Generate Inputs for Computer Systems", the entire disclosure of which is hereby incorporated herein by reference.

At least some embodiments disclosed herein allow the determination or estimation of the orientation of the torso (101) from the orientations of the upper arms (105 and 103) and if available, the orientation of the head (107) without the need for an additional sensor module being attached to the torso (101).

Figure 2:
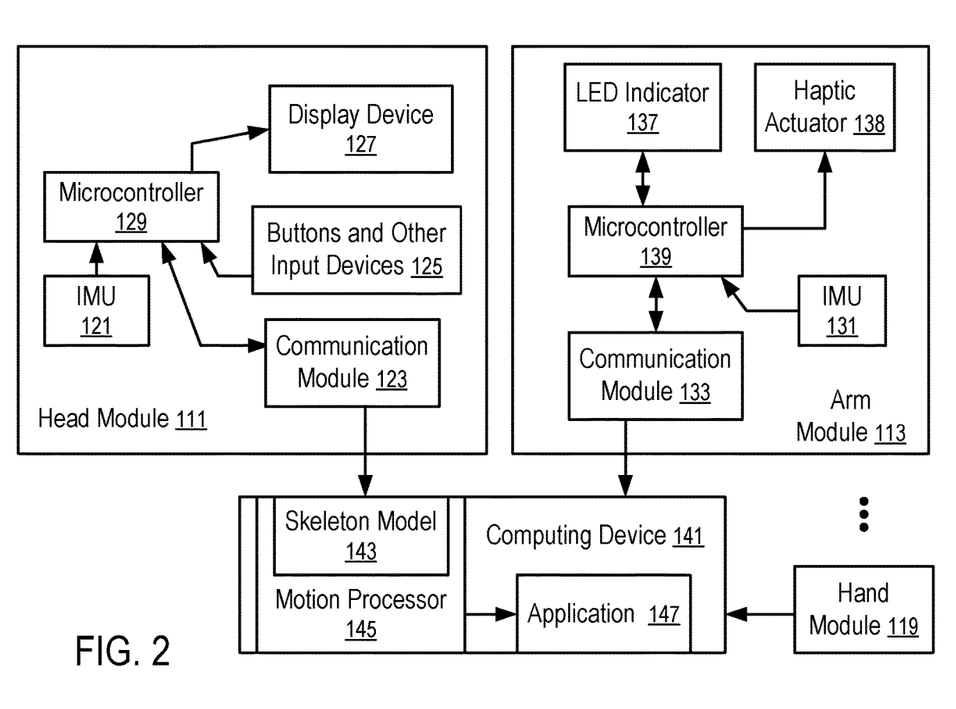
FIG. 2 illustrates a system to control computer operations according to one embodiment.

FIG. 2 illustrates a system to control computer operations according to one embodiment. For example, the system of FIG. 2 can be implemented via attaching the arm modules (115, 113) to the upper arms (105 and 103) respectively and optionally, the head module (111) to the head (107), in a way illustrated in FIG. 1.

In FIG. 2, the head module (111) and the arm module (113) have micro-electromechanical system (MEMS) inertial measurement units (IMUs) (121 and 131) that measure motion parameters and determine orientations of the head (107) and the upper arm (103). Similarly, the hand module (119) may also have its IMU.

Each of the IMUs (131, 121) has a collection of sensor components that enable the determination of the movement, position and/or orientation of the respective IMU along a number of axes. Examples of the components are: a MEMS accelerometer that measures the projection of acceleration (the difference between the true acceleration of an object and the gravitational acceleration); a MEMS gyroscope that measures angular velocities; and a magnetometer that measures the magnitude and direction of a magnetic field at a certain point in space. In some embodiments, the IMUs use a combination of sensors in three and two axes (e.g., without a magnetometer).

Figure 3:
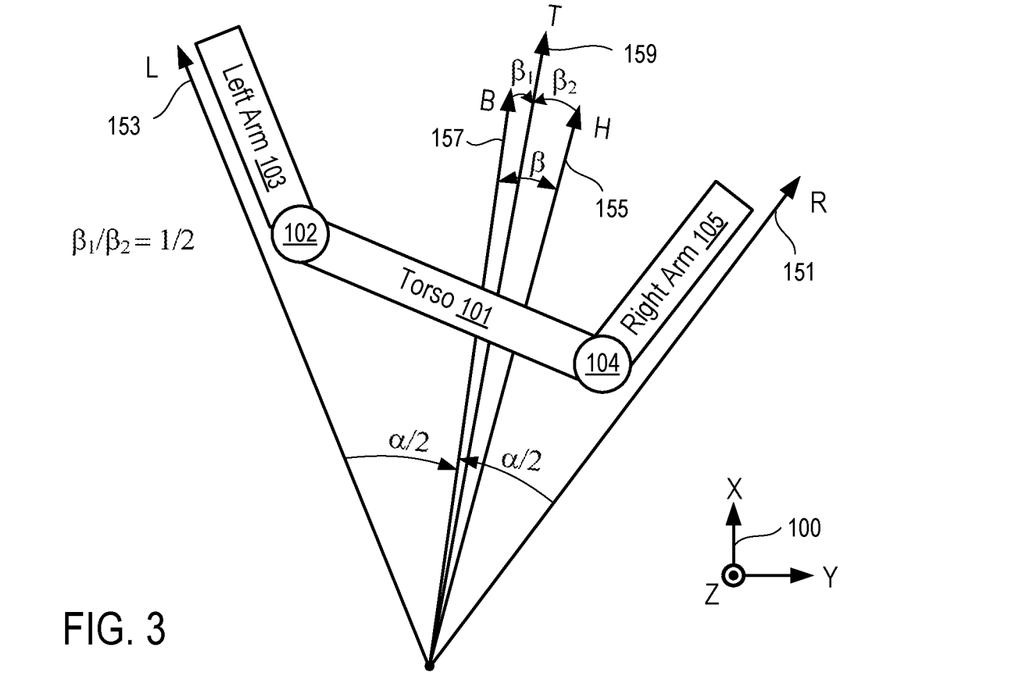
FIG. 3 illustrates a skeleton model and a method to determine the orientation of the torso of a user according to one embodiment.

The computing device (141) has a motion processor (145), which includes a skeleton model (143) of the user (e.g., illustrated FIG. 3). The motion processor (145) controls the movements of the corresponding parts of the skeleton model (143) according to the movements/orientations of the upper arms (103 and 105) measured by the arm modules (113 and 115), the movements/orientation of the head (107) measured by the head module (111), the movements/orientations of the hand (106 and 108) measured by the hand modules (117 and 119), etc.

Since the torso (101) does not have a separately attached sensor module, the movements/orientation of the torso (101) is calculated/estimated/predicted from the orientation of the arm modules (113 and 115) and if available, the orientation of the head module (111), as discussed below in connection with FIGS. 3-5.

The skeleton model (143) is controlled by the motion processor (145) to generate inputs for an application (147) running in the computing device (141). For example, the skeleton model (143) can be used to control the movement of an avatar/model of the arms (105 and 103), the hands (106 and 108), the head (107), and the torso (101) of the user of the computing device (141) in a video game, a virtual reality, a mixed reality, or augmented reality, etc.

Preferably, the arm module (113) has a microcontroller (139) to process the sensor signals from the IMU (131) of the arm module (113) and a communication module (133) to transmit the motion/orientation parameters of the arm module (113) to the computing device (141). Similarly, the head module (111) has a microcontroller (129) to process the sensor signals from the IMU (121) of the head module (111) and a communication module (123) to transmit the motion/orientation parameters of the head module (111) to the computing device (141).

Optionally, the arm module (113) and the head module (111) have LED indicators (137 and 127) respectively to indicate the operating status of the modules (113 and 111).

Optionally, the arm module (113) has a haptic actuator (138) respectively to provide haptic feedback to the user.

Optionally, the head module (111) has a display device (127) and/or buttons and other input devices (125), such as a touch sensor, a microphone, a camera, etc.

In some implementations, the head module (111) is replaced with a module that is similar to the arm module (113) and that is attached to the head (107) via a strap or is secured to a head mount display device.

In some applications, the hand module (119) can be implemented with a module that is similar to the arm module (113) and attached to the hand via holding or via a strap. Optionally, the hand module (119) has buttons and other input devices, such as a touch sensor, a joystick, etc.

For example, the handheld modules disclosed in U.S. patent application Ser. No. 15/792,255, filed Oct. 24, 2017 and entitled "Tracking Finger Movements to Generate Inputs for Computer Systems", U.S. patent application Ser. No. 15/787,555, filed Oct. 18, 2017 and entitled "Tracking Arm Movements to Generate Inputs for Computer Systems", and/or U.S. patent application Ser. No. 15/492,915, filed Apr. 20, 2017 and entitled "Devices for Controlling Computers based on Motions and Positions of Hands" can be used to implement the hand modules (117 and 119), the entire disclosures of which applications are hereby incorporated herein by reference.

FIG. 2 shows a hand module (119) and an arm module (113) as examples. An application for the tracking of the orientation of the torso (101) typically uses two arm modules (113 and 115) as illustrated in FIG. 1. The head module (111) can be used optionally to further improve the tracking of the orientation of the torso (101). Hand modules (117 and 119) can be further used to provide additional inputs and/or for the prediction/calculation of the orientations of the forearms of the user.

Typically, an IMU (e.g., 131 or 121) in a module (e.g., 113 or 111) generates acceleration data from accelerometers, angular velocity data from gyrometers/gyroscopes, and/or orientation data from magnetometers. The microcontrollers (139 and 129) perform preprocessing tasks, such as filtering the sensor data (e.g., blocking sensors that are not used in a specific application), applying calibration data (e.g., to correct the average accumulated error computed by the computing device (141)), transforming motion/position/orientation data in three axes into a quaternion, and packaging the preprocessed results into data packets (e.g., using a data compression technique) for transmitting to the host computing device (141) with a reduced bandwidth requirement and/or communication time.

Each of the microcontrollers (129, 139) may include a memory storing instructions controlling the operations of the respective microcontroller (129 or 139) to perform primary processing of the sensor data from the IMU (121, 131) and control the operations of the communication module (123, 133), and/or other components, such as the LED indicator (137), the haptic actuator (138), buttons and other input devices (125), the display device (127), etc.

The computing device (141) may include one or more microprocessors and a memory storing instructions to implement the motion processor (145). The motion processor (145) may also be implemented via hardware, such as Application-Specific Integrated Circuit (ASIC) or Field-Programmable Gate Array (FPGA).

In some instances, one of the modules (111, 113, 115, 117, and/or 119) is configured as a primary input device; and the other module is configured as a secondary input device that is connected to the computing device (141) via the primary input device. A secondary input device may use the microprocessor of its connected primary input device to perform some of the preprocessing tasks. A module that communicates directly to the computing device (141) is consider a primary input device, even when the module does not have a secondary input device that is connected to the computing device via the primary input device.

In some instances, the computing device (141) specifies the types of input data requested, and the conditions and/or frequency of the input data; and the modules (111, 113, 115, 117, and/or 119) report the requested input data under the conditions and/or according to the frequency specified by the computing device (141). Different reporting frequencies can be specified for different types of input data (e.g., accelerometer measurements, gyroscope/gyrometer measurements, magnetometer measurements, position, orientation, velocity).

In general, the computing device (141) may be a data processing system, such as a mobile phone, a desktop computer, a laptop computer, a head mount virtual reality display, a personal medial player, a tablet computer, etc.

FIG. 3 illustrates a skeleton model and a method to determine the orientation of the torso of a user according to one embodiment. For example, the skeleton model of FIG. 3 can be used in the motion processor (145) of FIG. 2 to determine the orientation of the torso (101) that does not have an attached sensor module, as illustrated in FIG. 1.

The skeleton model illustrated in FIG. 3 includes a torso (101) and left and right arms (103 and 105) that can move relative to the torso (101) via the shoulder joints (102 and 104). The skeleton model may further includes the forearms, hands (106 and 108), neck and/or head (107).

FIG. 3 illustrates the projection of the rotations of the arms (103) and the head (107) in the horizontal plane XY that is perpendicular to the vertical direction Z in the reference coordinate system (100).

For example, the directions L (153) and R (151) represent the lengthwise direction of the upper arms (103 and 105) as tracked/measured by the arm modules (113 and 115) and projected in the horizontal XY plane; and the direction H (155) represents the forward-facing direction of the head (107) as tracked/measured by the head module (111) and projected in the horizontal XY plane.

The directions L (153) and R (151) rotate relative to each other along the vertical axis Z in the horizontal XY plane to form an angle $\alpha$. The direction B (157) bisects the angle $\alpha$ between the directions L (153) and R (151).

The direction B (157) and the direction H (155) form an angle $\beta$ in the horizontal XY plane. The direction T (159) splits the angle $\beta$ according to a predeterminate ratio $\beta_1:\beta_2$ (e.g., 1:2).

Since the torso (101) does not have a sensor module that measures its orientation, the motion processor (145) estimates, calculates, or predicts the orientation of the torso (101) based on the directions L (153) and R (151) and if available, the direction H (155).

For example, when the head module (111) is not used and/or the direction H (155) is not available, the motion processor (145) computes the direction B (157) that bisects the directions L (153) and R (151) and uses the direction B (157) as the orientation of the torso (101).

For example, when the direction H (155) is available, the motion processor (145) computes the direction T (157) that splits, according to a predetermined ratio $\beta_2:\beta_1$ the angle $\beta$ between the direction H (155) and the direction B (157) that in turn bisects the directions L (153) and R (151). The motion processor (145) uses the direction T (157) as the orientation of the torso (101).

In some instances, it is assumed that the torso (101) remains vertical and does not bend or lean forward, backward, and/or sideway. Thus, the orientation of the torso (101) can be determined from the direction B (157) and/or T (157).

Figure 4:
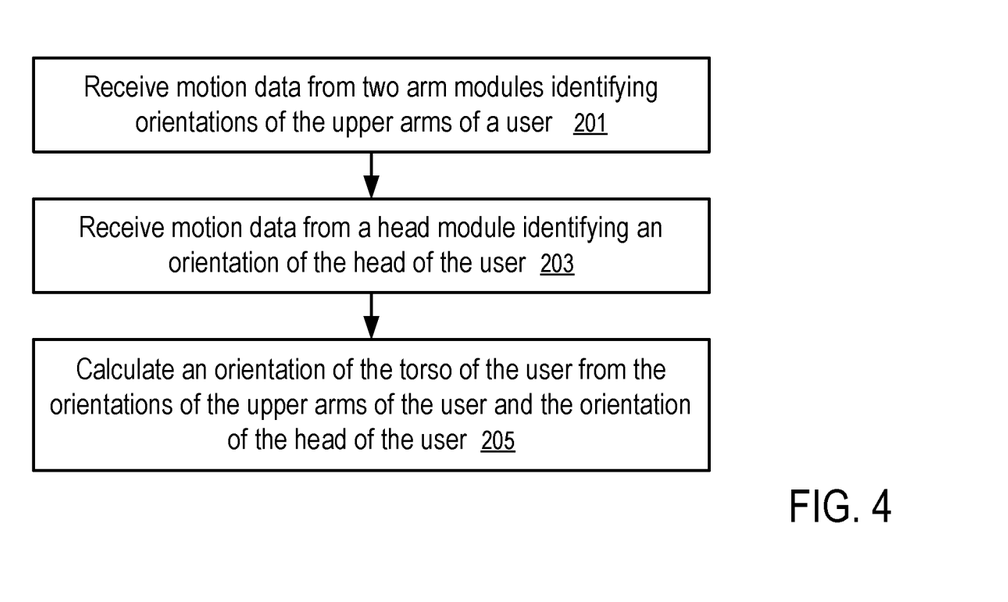
FIG. 4 shows a method to compute the orientation of the torso of a user according to one embodiment.

FIG. 4 shows a method to compute the orientation of the torso of a user according to one embodiment. For example, the method of FIG. 4 can be implemented in a system illustrated in FIG. 2 with arm modules (113 and 115) and a head module (111) worn by a user in a way illustrated FIG. 1 and using the geometrical relations identified via FIG. 3.

In FIG. 4, a computing device (141): receives (201) motion data from two arm modules (113 and 115) identifying current orientations of the upper arms (103 and 105) of a user; receives (203) motion data from a head module (111) identifying a current orientation of the head (107) of the user; and calculates (205) a current orientation of the torso (101) of the user from the current orientations of the upper arms (103 and 105) of the user and the current orientation of the head (107) of the user.

The method of FIG. 4 eliminates the need for attaching a separate sensor device to the torso (101) of the user to measure and determine the orientation of the torso (101) of the user.

Figure 5:
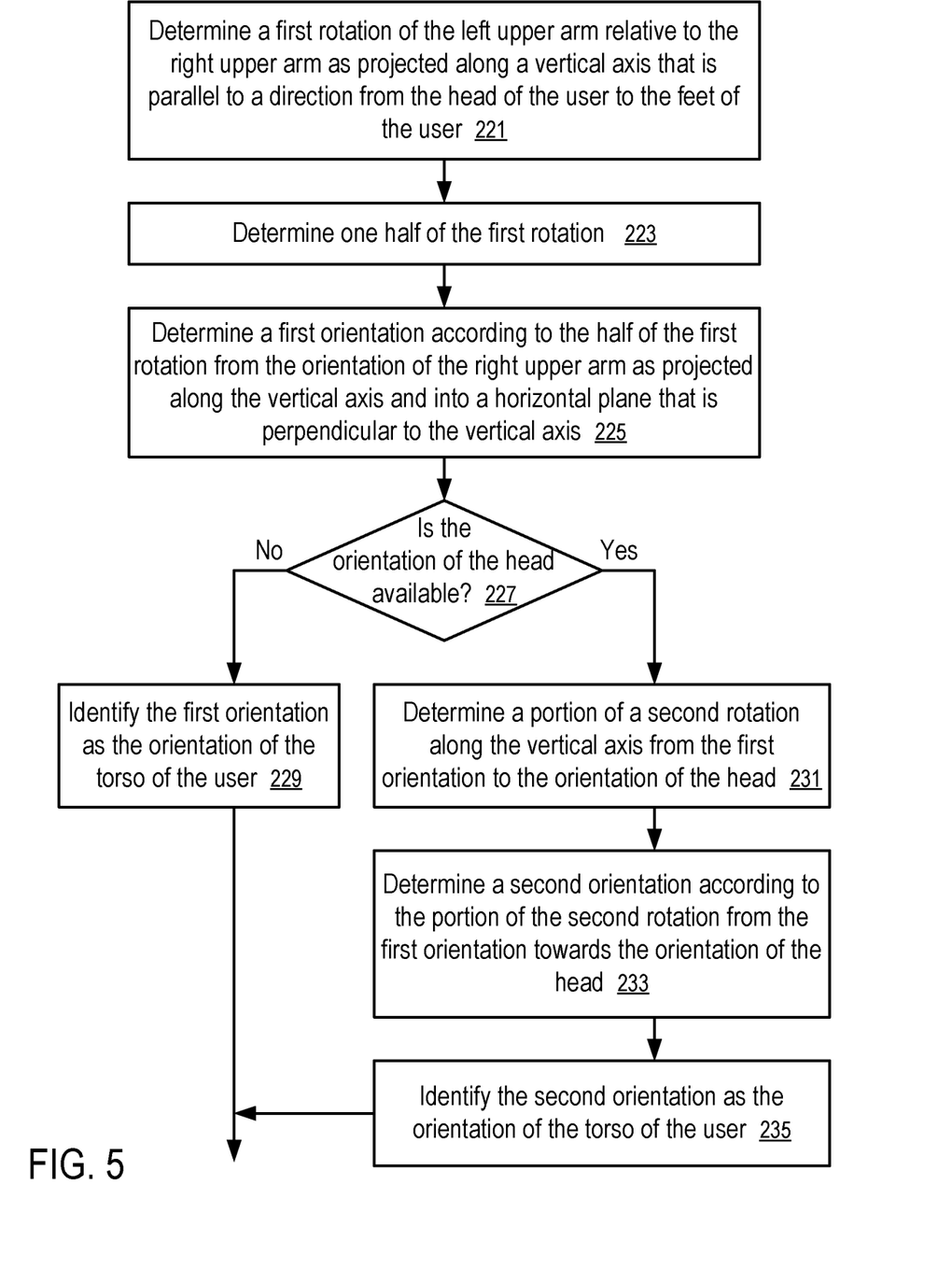
FIG. 5 shows a detailed method to compute the orientation of the torso of a user according to one embodiment.

FIG. 5 shows a detailed method to compute the orientation of the torso of a user according to one embodiment. For example, the method of FIG. 5 can be used to implement the calculation (205) of the orientation of the torso (101) in the method of FIG. 4.

In FIG. 5, the method includes: determining (221) a first rotation α of the left upper arm (103) relative to the right upper arm (105) as projected along a vertical axis Z that is parallel to a direction from the head (107) of the user to the feet of the user; determining (223) one half of the first rotation α; determining (225) a first orientation (157) according to the half of the first rotation α in the horizontal plane from the orientation of the right upper arm (105) (or from the orientation of the left upper arm (103)), as projected along the vertical axis Z and into a horizontal plane XY that is perpendicular to the vertical axis Z, towards the orientation of the left upper arm (103) (or from the orientation of the right upper arm (105)).

If it is determines (227) that the orientation of the head (107) is not available, the method further includes identify (229) the first orientation (157) as the orientation of the torso (101) of the user.

If it is determines (227) that the orientation of the head (107) is available, the method further includes: determining (231) a portion of a second rotation β along the vertical axis Z from the first orientation (157) to the orientation (155) of the head (107) as projected in the horizontal plane XY; determining (233) a second orientation (159) according to the portion of the second rotation from the first orientation (157) towards the orientation (155) of the head (107); and identifying (235) the second orientation (159) as the orientation of the torso (101) of the user.

As illustrated in FIG. 2, each of the arm modules (113 and 115) and the head module (111) is a sensor module that has an inertial measurement unit (IMU) (131, 121) for their orientation measurements. Preferably, the sensor module has a wireless communication device or module (133, 123) for a wireless communication link with the computing device (141). Alternatively, wired connections can be used. The inertial measurement unit (IMU) (131, or 121) of the sensor module (113, or 115) may include a micro-electromechanical system (MEMS) gyroscope, a magnetometer, and/or a MEMS accelerometer.

The method of FIG. 5 allows the calculation of the estimated/approximated orientation of the torso (101) without a need for a separate inertial measurement unit or sensor module attached to the torso (101) of the user, which arrangement reduces the cost of the system and improves user experiences.

The present disclosure includes methods and apparatuses which perform these methods, including data processing systems which perform these methods, and computer readable media containing instructions which when executed on data processing systems cause the systems to perform these methods.

For example, the computing device (141), the arm modules (113, 115) and/or the head module (111) can be implemented using one or more data processing systems.

A typical data processing system may include includes an inter-connect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices may include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory may include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A system, comprising:
a first sensor module having an inertial measurement unit and attached to a left upper arm of a user, the first sensor module generating first motion data identifying an orientation of the left upper arm;
a second sensor module having an inertial measurement unit and attached to a right upper arm of the user, the second sensor module generating second motion data identifying an orientation of the right upper arm;
a third sensor module having an inertial measurement unit and attached to a head of the user, the third sensor module generating third motion data identifying an orientation of the head; and
a computing device coupled to the first sensor module, the second sensor module, and the third sensor module through communication links, the computing device calculating an orientation of a torso of the user based on the orientation of the left upper arm, the orientation of the right upper arm, and the orientation of the head, the calculating the orientation of the torso comprising
computing a facing direction of the user's torso based on identifying a bisecting direction that bisects the first and second motion data, and
calculating the orientation of the torso by identifying a second direction based on the bisecting direction and a predetermined ration, the predetermined ratio representing the angles between the second direction and the bisecting direction and the second direction and a direction of the orientation of the user's head.

2. The system of claim 1, wherein the computing device calculates the orientation of the torso by:
determining a first rotation along a vertical axis between the orientation of the left upper arm and the orientation of the right upper arm;
calculating a second rotation that is one half of the first rotation;
determining a first orientation that has the second rotation along the vertical axis from the orientation of the left upper arm and the second rotation along the vertical axis from the orientation of the right upper arm;

determining a third rotation along a vertical axis between the orientation of the first orientation and the orientation of the head;

calculating a fourth rotation according to a predetermined ratio between the fourth rotation and the third rotation; and determining a second orientation that has the fourth rotation along the vertical axis from the first orientation towards the orientation of the head.

3. The system of claim 2, wherein the predetermined ratio is 1/3.

4. The system of claim 2, wherein the third sensor module is integrated in a head mount display device.

5. The system of claim 1, wherein each of the first sensor module, the second sensor module, the third sensor module further includes a communication device for a communication link with the computing device.

6. The system of claim 1, wherein each of the inertial measurement unit of the first sensor module, the inertial measurement of the second sensor module, and the inertial measurement of the third sensor module includes a microelectromechanical system (MEMS) gyroscope.

7. The system of claim 6, wherein each of the inertial measurement unit of the first sensor module, the inertial measurement of the second sensor module, and the inertial measurement of the third sensor module further includes a magnetometer and a MEMS accelerometer.

8. The system of claim 1, wherein the orientation of the torso is calculated without an inertial measurement unit attached to the torso of the user.

9. The system of claim 1, wherein the orientation of the torso is calculated without a sensor module on the torso of the user.

10. A method, comprising:
receiving, from a first sensor module attached to a left upper arm of a user, first motion data identifying an orientation of the left upper arm;
receiving, from a second sensor module attached to a right upper arm of the user, second motion data identifying an orientation of the right upper arm;
calculating an orientation of a torso of the user based at least on the orientation of the left upper arm and the orientation of the right upper arm, wherein the calculating includes: determining a first direction that bisects, in a horizontal plane: a projection of a lengthwise direction of the left upper arm on the horizontal plane; and a projection of a lengthwise direction of the right upper arm on the horizontal plane; wherein the orientation of the torso of the user is based on the first direction; and
determining a position of the user in a three dimensional space based on the orientation of the left upper arm, the orientation of the torso, the orientation of the right upper arm, and a skeleton model of the user.

11. The method of claim 10, wherein the calculating further includes:
computing the lengthwise direction of the left upper arm from the orientation of the left upper arm;
projecting the lengthwise direction of the left upper arm onto the horizontal plane to obtain a projected lengthwise direction of the left upper arm;
computing the lengthwise direction of the right upper arm from the orientation of the right upper arm;
projecting the lengthwise direction of the right upper arm onto the horizontal plane to obtain a projected lengthwise direction of the right upper arm; and computing an angle between the projected lengthwise direction of the left upper arm and the projected lengthwise direction of the right upper arm.

12. The method of claim 11, wherein the first direction is calculated by rotating in the horizontal plane the projected lengthwise direction of the left upper arm, or the projected lengthwise direction of the right upper arm, according to one half of the angle.

13. The method of claim 10, wherein the calculating further includes:
determining that an orientation of a head of user is not available; and
identifying the orientation of the torso to face the first direction.

14. The method of claim 10, further comprising:
receiving, from a third sensor module attached to a head of the user, third motion data identifying an orientation of the head;
wherein the calculating further includes:
determining a second direction that divides, in the horizontal plane and according to a predetermined ratio, an angle between:
a projection of a forward-facing direction of the head in the horizontal plane; and
the first direction; and
identifying the orientation of the torso to face the second direction.

15. The method of claim 14, wherein the predetermined ratio is 1:2.

16. The method of claim 14, wherein the determining of the second direction includes:
projecting the forward-facing direction of the head onto the horizontal plane to obtain a third direction;
computing the angle of rotation in the horizontal plane and between the first direction and the third direction;
determining a portion of the angle according to the predetermined ratio; and
rotating the first direction within the horizontal plane by the portion of the angle towards the third direction.

17. A non-transitory computer storage medium storing instructions which, when executed by a computing device, instructs the computing device to perform a method, the method comprising:
receiving, from a first sensor module attached to a left upper arm of a user, first motion data identifying an orientation of the left upper arm;
receiving, from a second sensor module attached to a right upper arm of the user, second motion data identifying an orientation of the right upper arm;
calculating an orientation of a torso of the user based at least on the orientation of the left upper arm and the orientation of the right upper arm, wherein the calculating includes: determining a first direction that bisects, in a horizontal plane: a projection of a lengthwise direction of the left upper arm on the horizontal plane; and a projection of a lengthwise direction of the right upper arm on the horizontal plane; wherein the orientation of the torso of the user is based on the first direction; and
determining a position of the user in a three dimensional space based on the orientation of the left upper arm, the orientation of the torso, the orientation of the right upper arm, and a skeleton model of the user.

18. The non-transitory computer storage medium of claim 17, wherein the calculating comprises:

receiving, from a third sensor module attached to a head of the user, third motion data identifying an orientation of the head;

wherein the calculating further includes:

determining a second direction that divides, in the horizontal plane and according to a predetermined ratio, an angle between: a projection of a forward-facing direction of the head in the horizontal plane; and the first direction; and identifying the orientation of the torso as facing the second direction.

19. The non-transitory computer storage medium of claim 17, wherein the calculating comprises:

in response to a determination that an orientation of a head of user is not available, identifying the orientation of the torso as facing the first direction.

* * * * *